(12) United States Patent
Little

(10) Patent No.: US 10,356,540 B2
(45) Date of Patent: *Jul. 16, 2019

(54) LIFETIME OF AN AUDIO PLAYBACK DEVICE WITH CHANGED SIGNAL PROCESSING SETTINGS

(71) Applicant: SONOS, INC., Santa Barbara, CA (US)

(72) Inventor: Richard Little, Santa Barbara, CA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/882,610

(22) Filed: Jan. 29, 2018

(65) Prior Publication Data

US 2018/0152797 A1     May 31, 2018

Related U.S. Application Data

(63) Continuation of application No. 15/224,204, filed on Jul. 29, 2016, now Pat. No. 9,883,304.

(51) Int. Cl.
*H03G 3/30* (2006.01)
*H04R 29/00* (2006.01)

(52) U.S. Cl.
CPC ......... *H04R 29/001* (2013.01); *H03G 3/3005* (2013.01); *H04R 29/007* (2013.01);
(Continued)

(58) Field of Classification Search
CPC ......... H04S 2400/13; H04S 7/30; H04R 3/12; H04R 1/24; H04R 29/001; H04R 29/008; H04R 1/2834; H04R 1/2896; H04R 3/00; H04R 3/04; H04R 2430/01; H04R 5/04; H04R 1/403; H04R 29/00; H04R 1/323; H04R 25/505; G06F 3/165; H03G 5/165; H03G 3/20; H03G 11/04; H03G 5/025;
(Continued)

(56) References Cited

U.S. PATENT DOCUMENTS 5,032,202 A      7/1991   Tsai et al.
5,095,509 A  *   3/1992   Volk .................. H04R 1/005
                                                       381/111
(Continued)

FOREIGN PATENT DOCUMENTS

EP    1389853 A1      2/2004
WO    200153994       7/2001
WO    2003093950 A2  11/2003

OTHER PUBLICATIONS

AudioTron Quick Start Guide, Version 1.0, Mar. 2001, 24 pages.
(Continued)

*Primary Examiner* — Mohammad K Islam

(57) ABSTRACT

A first lifetime estimate is determined for a first acoustic component of a first audio playback device configured with first signal processing settings. A second audio playback device is configured with second signal processing settings. A second lifetime estimate is determined for a second acoustic component of the second audio playback device configured with the second signal processing settings, where the second lifetime estimate is determined based on first lifetime estimate and where the first acoustic component is substantially similar to the second acoustic component.

20 Claims, 13 Drawing Sheets

(52) U.S. Cl.
CPC .. *H04R 2227/003* (2013.01); *H04R 2227/005* (2013.01); *H04R 2499/13* (2013.01)

(58) Field of Classification Search
CPC ...... H03G 3/3089; H03G 5/16; B06B 1/0215; B66B 3/00; H03K 5/084; H03K 7/08
See application file for complete search history.

(56) References Cited

U.S. PATENT DOCUMENTS

| | | | |
|---|---|---|---|
| 5,440,644 | A | 8/1995 | Farinelli et al. |
| 5,761,320 | A | 6/1998 | Farinelli et al. |
| 5,923,902 | A | 7/1999 | Inagaki |
| 6,256,554 | B1 | 7/2001 | DiLorenzo |
| 6,404,811 | B1 | 6/2002 | Cvetko et al. |
| 6,469,633 | B1 | 10/2002 | Wachter |
| 6,522,886 | B1 | 2/2003 | Youngs et al. |
| 6,611,537 | B1 | 8/2003 | Edens et al. |
| 6,631,410 | B1 | 10/2003 | Kowalski et al. |
| 6,757,517 | B2 | 6/2004 | Chang |
| 6,778,869 | B2 | 8/2004 | Champion |
| 7,130,608 | B2 | 10/2006 | Hollstrom et al. |
| 7,130,616 | B2 | 10/2006 | Janik |
| 7,143,939 | B2 | 12/2006 | Henzerling |
| 7,236,773 | B2 | 6/2007 | Thomas |
| 7,295,548 | B2 | 11/2007 | Blank et al. |
| 7,343,017 | B2 * | 3/2008 | Norris .............. H04B 11/00 381/77 |
| 7,391,791 | B2 | 6/2008 | Balassanian et al. |
| 7,483,538 | B2 | 1/2009 | McCarty et al. |
| 7,571,014 | B1 | 8/2009 | Lambourne et al. |
| 7,630,501 | B2 | 12/2009 | Blank et al. |
| 7,643,894 | B2 | 1/2010 | Braithwaite et al. |
| 7,657,910 | B1 | 2/2010 | McAulay et al. |
| 7,812,504 | B1 * | 10/2010 | Trandafir .............. H01L 41/042 310/317 |
| 7,853,341 | B2 | 12/2010 | McCarty et al. |
| 7,987,294 | B2 | 7/2011 | Bryce et al. |
| 8,014,423 | B2 | 9/2011 | Thaler et al. |
| 8,045,952 | B2 | 10/2011 | Qureshey et al. |
| 8,103,009 | B2 | 1/2012 | McCarty et al. |
| 8,234,395 | B2 | 7/2012 | Millington et al. |
| 8,483,853 | B1 | 7/2013 | Lambourne |
| 8,847,568 | B2 * | 9/2014 | Barrenscheen ....... H02M 3/156 323/284 |
| 8,942,252 | B2 | 1/2015 | Balassanian et al. |
| 2001/0042107 | A1 | 11/2001 | Palm |
| 2002/0022453 | A1 | 2/2002 | Balog et al. |
| 2002/0026442 | A1 | 2/2002 | Lipscomb et al. |
| 2002/0124097 | A1 | 9/2002 | Isely et al. |
| 2003/0157951 | A1 | 8/2003 | Hasty |
| 2004/0024478 | A1 | 2/2004 | Hans et al. |
| 2007/0127738 | A1 * | 6/2007 | Yamada ................... H04R 3/04 381/98 |
| 2007/0142944 | A1 | 6/2007 | Goldberg et al. |
| 2008/0266241 | A1 * | 10/2008 | Kimura ................ G09G 3/3406 345/102 |
| 2010/0272270 | A1 * | 10/2010 | Chaikin ............... H04R 29/008 381/59 |
| 2011/0118859 | A1 * | 5/2011 | Theimer ................... H04S 7/30 700/94 |
| 2016/0118893 | A1 * | 4/2016 | Doyle .................... H02M 3/158 323/271 |
| 2016/0197590 | A1 * | 7/2016 | Koppens ................. H03G 7/007 381/106 |
| 2017/0026015 | A1 * | 1/2017 | Hartung .................... H03G 3/32 |
| 2017/0126119 | A1 * | 5/2017 | Bernardon .............. H02M 1/08 |

OTHER PUBLICATIONS

AudioTron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Non-Final Office Action dated Jun. 15, 2017, issued in connection with U.S. Appl. No. 15/224,204, filed Jul. 29, 2016, 7 pages.
Notice of Allowance dated Oct. 2, 2017, issued in connection with U.S Appl. No. 15/224,204, filed Jul. 29, 2016, 7 pages.
Palm, Inc., "Handbook for the Palm VII Handheld," May 2000, 311 pages.
Presentations at WinHEC 2000, May 2000, 138 pages.
United States Patent and Trademark Office, U.S Appl. No. 60/490,768, filed Jul. 28, 2003, entitled "Method for synchronizing audio playback between multiple networked devices," 13 pages.
United States Patent and Trademark Office, U.S Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

\* cited by examiner

Volume Setting Matrix

| Volume Setting | Usage |
|---|---|
| 10 | 10% |
| 20 | 40% |
| 50 | 20% |
| 100 | 5% |

LIFETIME OF AN AUDIO PLAYBACK DEVICE WITH CHANGED SIGNAL PROCESSING SETTINGS

CROSS-REFERENCE TO RELATED APPLICATIONS

This application claims priority under 35 U.S.C. § 120 to, and is a continuation of, U.S. patent application Ser. No. 15/224,204 filed on Jul. 29, 2016, entitled "Lifetime of an Audio Playback Device with Changed Signal Processing Settings", the contents of which are hereby incorporated by reference in its entireties for all purposes.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play audio in any room that has a networked playback device. Additionally, using the control device, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

FIG. 13 shows an example of a volume setting matrix; and

Figure 1:
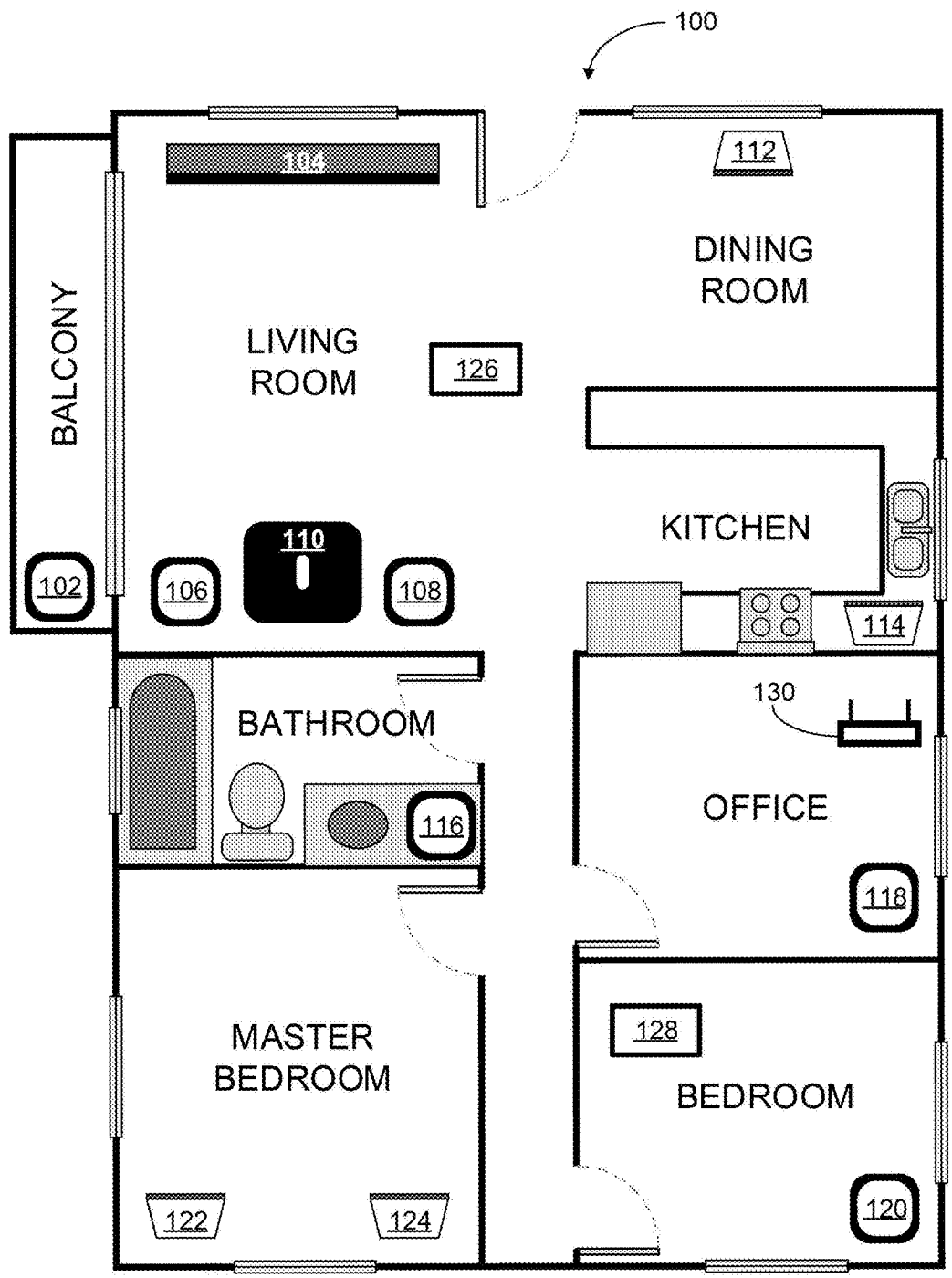
FIG. 1 shows an example playback system configuration in which certain embodiments may be practiced.

The drawings are for the purpose of illustrating example embodiments, but it is understood that the embodiments are not limited to the arrangements and instrumentality shown in the drawings.

DETAILED DESCRIPTION

I. Overview

An audio playback device typically has acoustic components for converting electrical signals indicative of source audio content such as music into audible sound. Typically, the acoustic components include a transducer and/or associated soft (e.g., elastic) components of the transducer with a finite lifetime. The acoustic components may be associated, for example, with a woofer, tweeter, or mid-range speaker. A lifetime of the acoustic component of the audio playback device may be how long the acoustic component of the audio playback device operates before failing. Failure may be defined as when the audio component no longer outputs audio sound, outputs distorted audio sound, and/or outputs audio sound not reflective of the source audio content input into the transducer.

An audio playback device may have certain signal processing settings. Some settings may be configurable by a user such as volume, loudness, base, treble, and frequency equalization. Other settings may be defined by a manufacturer such as how far a diaphragm of the transducer can linearly travel from its resting position and/or filters that are applied to the source audio content prior to the audio playback device playing back the source audio content.

Different signal processing settings may place different stresses on the soft components of the transducer. The stresses result in fatigue and progressive failure of the soft components at a microscopic level, e.g., weakening of molecule bonds at defect sites. In this regard, the signal processing settings of the audio playback device may affect the lifetime of the acoustic component of the audio playback device.

A manufacturer of an audio playback device may determine the lifetime of an acoustic component of the audio playback device when configured with certain signal processing settings. Typically, the determination may have been made through traditional reliability testing which involves mechanically stressing acoustic components of an audio playback device for long periods of time (e.g., 120 days) in a test environment such as a laboratory. There may be a need at some later time to change the signal processing settings for the audio playback device. For example, the manufacturer may want to change the signal processing settings to improve audio quality of its audio playback devices. The manufacturer may want to know whether the changed signal processing settings may increase or decrease a lifetime of the acoustic component of the audio playback device without having to mechanically stress acoustic components of an audio playback device implementing the changed signal processing setting for the long periods of time.

Embodiments described herein are directed to determining a lifetime estimate of an acoustic component of an audio playback device when the signal processing settings of the audio playback device is changed. The lifetime estimate of the acoustic component can be determined without needing to perform the traditional reliability testing again. Instead, the lifetime estimate of the acoustic component determined before the signal processing settings was changed can be used to determine the lifetime estimate of the acoustic component after the signal processing settings of the audio playback device is changed.

The lifetime estimate of the acoustic component of the audio playback device with changed signal processing settings may be determined by applying one or more factors to the lifetime estimate determined during the traditional reliability tests.

The factors may include a cycle time acceleration factor, a cycle stress accelerator, and a time scale accelerator. A cycle time acceleration factor may be ratio of an average cycle time of an acoustic component of the audio playback device when configured with the changed signal processing settings to the average cycle time of the acoustic component of the audio playback device when configured with the signal processing settings used during the traditional reliability test. A cyclic stress acceleration factor may be ratio of an average cyclic stress of an acoustic component of the audio playback device when configured with the changed signal processing settings to the average cyclic stress of the acoustic component of the audio playback device when configured with the signal processing settings used during the traditional reliability test. The timescale acceleration factor may be a ratio of the lifetime estimate determined during the traditional reliability test to an indication of usage of the audio playback device. The indication of usage may be how long the audio playback device is used, e.g., used for 3 hours in a day, 12 hours in a week. Alternatively, the indication of usage may take the form of a duty cycle. The duty cycle may be a ratio expressing a percentage of usage of the audio playback device within a duration of time, e.g., a day, week, month.

The following expression may be then evaluated to determine the lifetime estimate of the audio playback device based on the changed signal processing settings.

$$t_{field} >= (A_{scale})*(A_{ct}/A_{cs})$$

where $A_{ct}$ is the cycle time acceleration factor, $A_{cs}$ is the cyclic stress acceleration factor, and $A_{scale}$ is the timescale acceleration factor.

The lifetime estimate may be output to a user interface of a network device and/or communicated to another network device. A comparison of the first lifetime estimate and the second lifetime estimate may facilitate a determination of whether changing the signal processing settings of the audio playback device will negatively impact a lifetime of the acoustic component of the audio playback device. For example, the lifetime estimate of an acoustic component of the audio playback device when configured with first signal processing setting may be higher than the lifetime estimate of the acoustic component of the audio playback device when configured with second signal processing setting. The decrease may indicate that the new signal processing settings are unacceptable. On the other hand, the new signal processing settings may still be acceptable even though the lifetime estimate decreased. For instance, if the lifetime estimate decreases from 130 years to 100 years, the new signal processing settings may still be acceptable. This may be the case if the acoustic component of the audio playback device is not expected to be in operation for so long anyways. For instance, the audio playback device may not be expected to be used for that long, or alternatively, one or more other components of the audio playback device are expected to fail before the end of the lifetime estimate of the acoustic component. But if the lifetime estimate decreases from 10 years to 2 years, the new signal processing settings may not be acceptable because the lifetime of the acoustic component has decreased so low that it may fall below an expected lifetime of the acoustic component and further, the expected lifetime of the audio playback device.

Moving on from the above illustration, an example embodiment may include determining a first lifetime estimate for a first acoustic component of a first audio playback device configured with first signal processing settings; configuring a second audio playback device with second signal processing settings; determining a second lifetime estimate for a second acoustic component of the second audio playback device configured with the second signal processing settings, wherein the second lifetime estimate is determined based on first lifetime estimate and wherein the first acoustic component is substantially similar to the second acoustic component; and outputting the second lifetime estimate. The first acoustic component may be a transducer. Determining a first lifetime estimate may comprise operating the first audio playback device at predetermined volume until the first transducer fails. Determining the second lifetime estimate may comprise applying a lifetime acceleration factor to the first lifetime estimate, wherein the lifetime acceleration factor is based on an indication of cyclic movement of the first acoustic component and the second acoustic component. Determining a first lifetime estimate for a first acoustic component of a first audio playback device configured with first signal processing settings may comprise receiving the first lifetime estimate from memory. The second acoustic component may be a transducer. A maximum displacement of a diaphragm of the transducer may be determined. Determining a second lifetime estimate for the second audio playback device may comprise comparing the maximum displacement to a threshold amount; and determining the second lifetime estimate in response to the maximum displacement not exceeding the threshold amount. Outputting the second lifetime estimate may comprise comparing the second lifetime estimate to an indication of an acceptable lifetime for the first and second audio playback device. Determining a second lifetime estimate may comprise adjusting the first lifetime estimate based on an indication of usage of the second audio playback device. Determining a second lifetime estimate may comprise calculating an average cycle time and an average cyclic stress amplitude associated with cyclic movement of the first acoustic component and second acoustic component.

Another example embodiment may include a network device comprising at least one processor; data storage; and a program logic stored in the data storage and executable by the at least one processor to perform functions comprising: determining a first lifetime estimate for a first acoustic component of a first audio playback device configured with first signal processing settings; configuring a second audio playback device with second signal processing settings; determining a second lifetime estimate for a second acoustic component of the second audio playback device configured with the second signal processing settings, wherein the second lifetime estimate is determined based on first lifetime estimate and wherein the first acoustic component is substantially similar to the second acoustic component; and outputting the second lifetime estimate. The first acoustic component may be a transducer. The program logic for determining a first lifetime estimate may comprise operating the audio playback device at a predetermined volume until the transducer fails. The program logic for determining the second lifetime estimate may comprise applying a lifetime acceleration factor to the first lifetime estimate, wherein the lifetime acceleration factor is based on an indication of cyclic movement of the first acoustic component and second acoustic component. The first lifetime estimate may be based on a shape of a continuous probability distribution that characterizes a failure rate of the first acoustic component of the first audio playback device. The second acoustic component may be a transducer. The network device may further comprise program logic for determining a maximum displacement of a diaphragm of the transducer and wherein determining a second lifetime estimate for the second audio playback device comprises comparing the maximum displacement to a threshold amount; and determining the second lifetime estimate in response to the maximum displacement not exceeding the threshold amount. The first audio playback device may be configured with first signal processing settings and the second audio playback device may be configured with second signal processing settings is a same physical device. The program logic for determining a second lifetime estimate may comprise adjusting the first lifetime estimate based on an indication of usage of the second audio playback device. The program logic for determining a second lifetime estimate may comprise calculating an average cycle time and an average cyclic stress amplitude associated with cyclic movement of the first acoustic component and second acoustic component.

Yet another example embodiment may include tangible, non-transitory computer-readable memory having stored thereon instructions that, when executed by one or more processors of a computing device, cause the computing device to perform functions comprising: determining a first lifetime estimate for a first acoustic component of a first audio playback device configured with first signal processing settings; configuring a second audio playback device with second signal processing settings; determining a second lifetime estimate for a second acoustic component of the second audio playback device configured with the second signal processing settings, wherein the second lifetime estimate is determined based on first lifetime estimate and wherein the first acoustic component is substantially similar to the second acoustic component; and outputting the second lifetime estimate. The tangible, non-transitory computer-readable memory may further comprise instructions to cause the computing device to receive an indication of usage of the second audio playback device. The instructions for determining a second lifetime estimate may comprise instructions for adjusting the first lifetime estimate based on the indication of usage of the second audio playback device. The instructions for determining a first lifetime estimate may comprise instructions for operating the first audio playback device at a predetermined volume until the first acoustic component of the first audio playback device fails.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102-124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
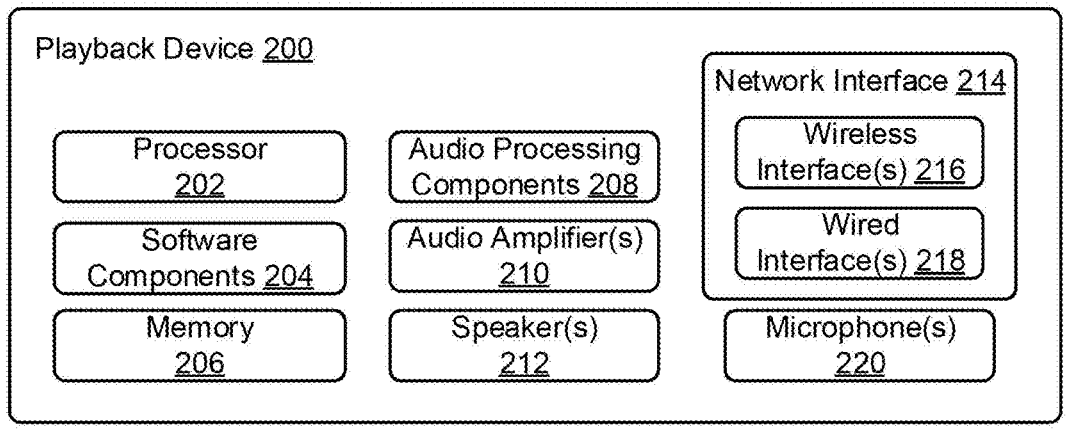
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, a network interface 214 including wireless interface(s) 216 and wired interface(s) 218, and microphone(s) 220. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

The microphone(s) 220 may be arranged to detect sound in the environment of the playback device 200. For instance, the microphone(s) may be mounted on an exterior wall of a housing of the playback device. The microphone(s) may be any type of microphone now known or later developed such as a condenser microphone, electret condenser microphone, or a dynamic microphone. The microphone(s) may be sensitive to a portion of the frequency range of the speaker(s) 212. One or more of the speaker(s) 212 may operate in reverse as the microphone(s) 220. In some aspects, the playback device 200 might not have microphone(s) 220.

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
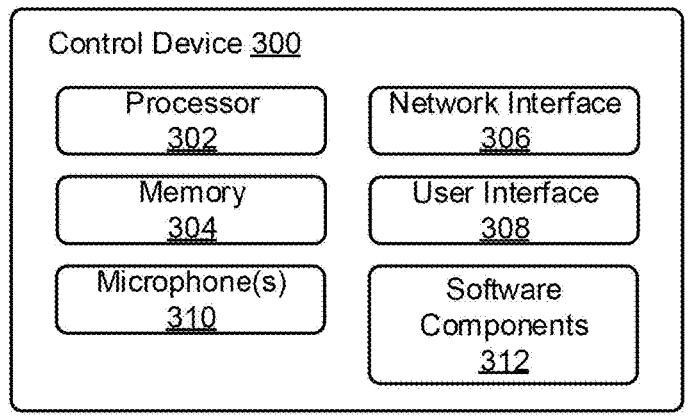
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, a user interface 308, microphone(s) 310, and software components 312. In one example, the control device 300 may be a dedicated controller for the media playback system 100. In another example, the control device 300 may be a network device on which media playback system controller application software may be installed, such as for example, an iPhone™, iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be data storage that can be loaded with one or more of the software components executable by the processor 302 to perform those functions. The memory 304 may also be configured to store the media playback system controller application software and other data associated with the media playback system 100 and the user.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Control device 300 may include microphone(s) 310. Microphone(s) 310 may be arranged to detect sound in the environment of the control device 300. Microphone(s) 310 may be any type of microphone now known or later developed such as a condenser microphone, electret condenser microphone, or a dynamic microphone. The microphone(s) may be sensitive to a portion of a frequency range. Two or more microphones 310 may be arranged to capture location information of an audio source (e.g., voice, audible sound) and/or to assist in filtering background noise.

Figure 4:
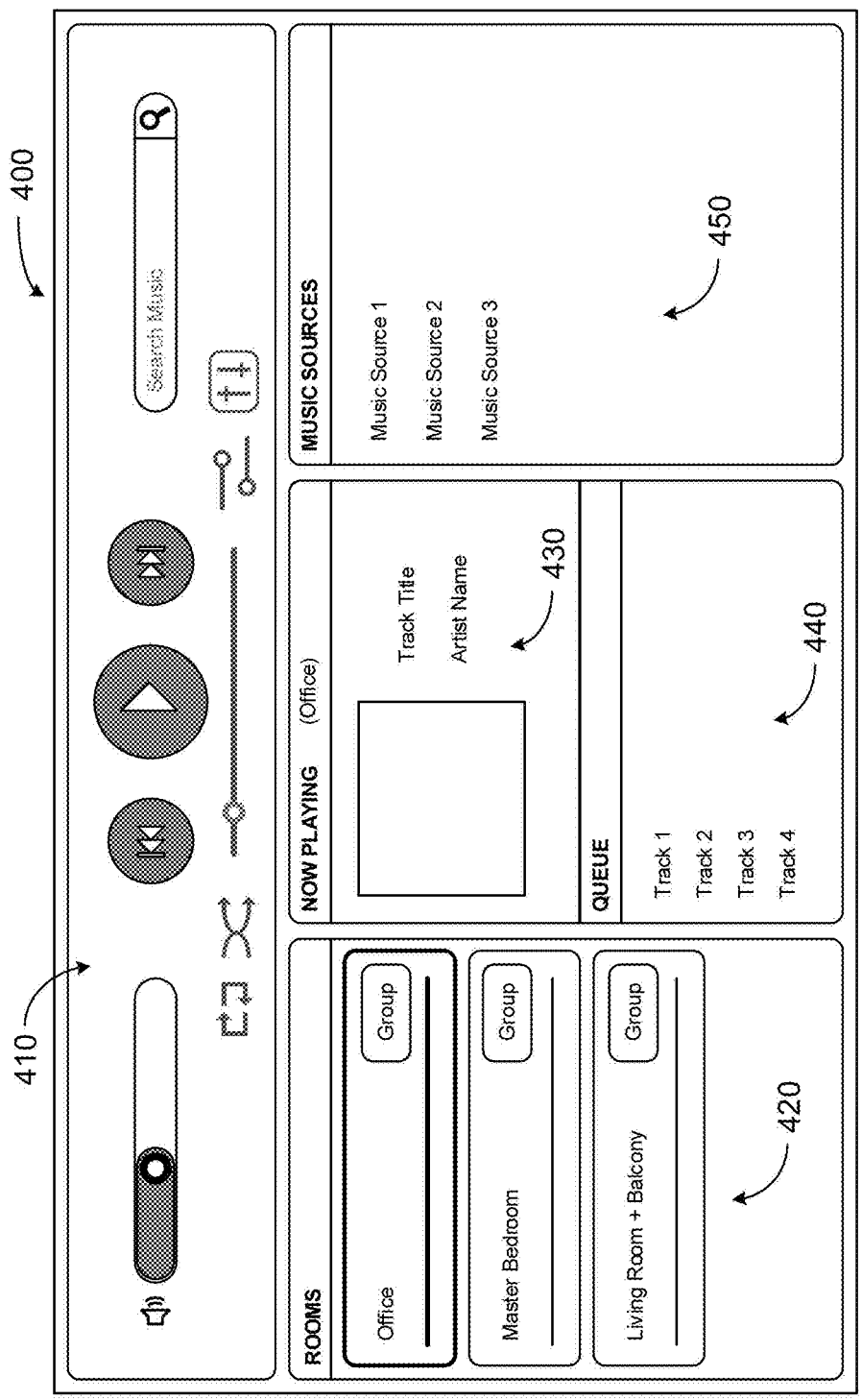
FIG. 4 shows an example control device interface.

The user interface 308 of the control device 300 may be configured to facilitate user access and control of the media playback system 100, by providing a user interface such as the controller interface 400 shown in FIG. 4. The controller interface 400 includes a playback control region 410, a playback zone region 420, a playback status region 430, a playback queue region 440, and an audio content sources region 450. The controller interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the controller interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface of the controller interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface of the controller interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

e. Example Plurality of Networked Devices

Figure 5:
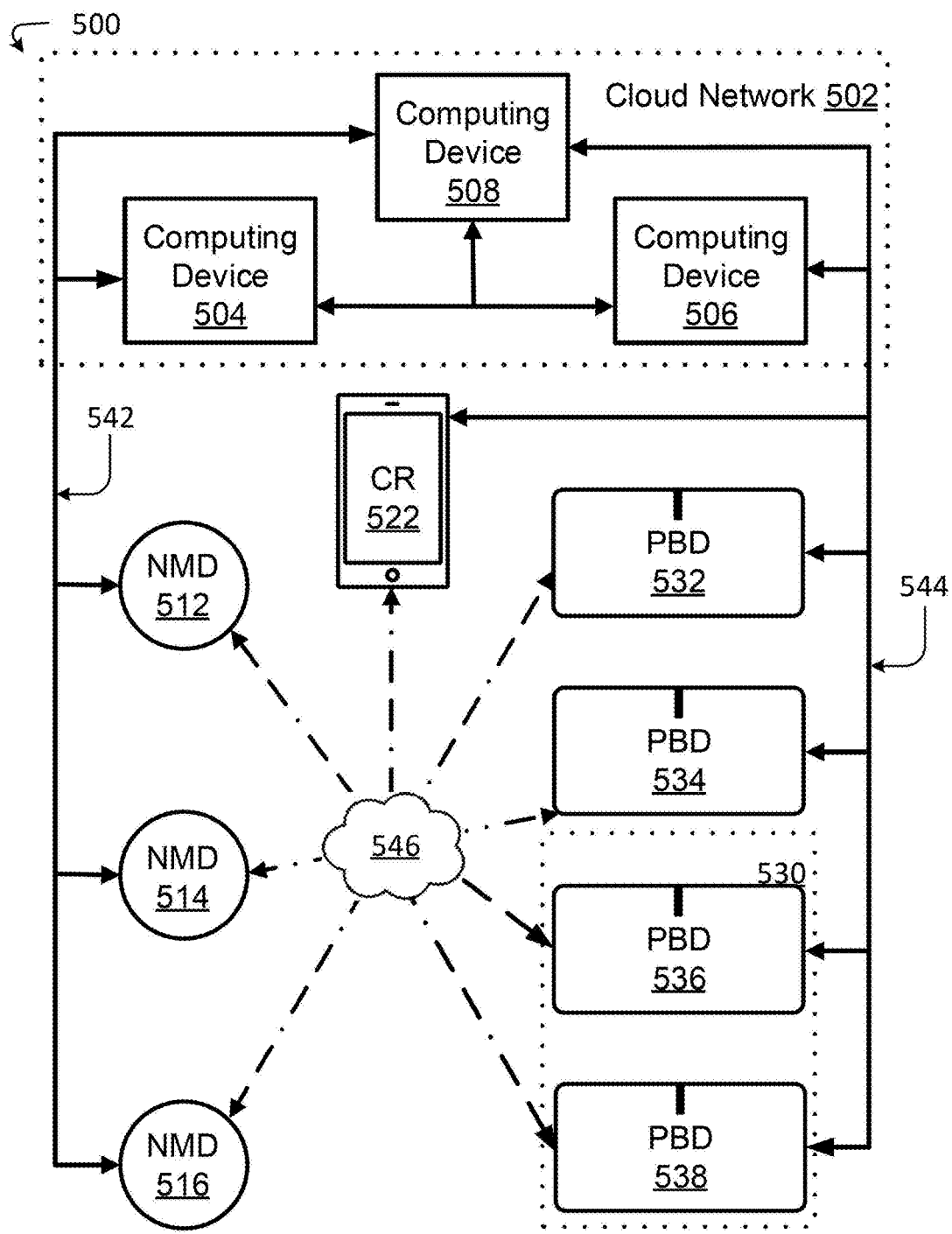
FIG. 5 shows an example network configuration in which certain embodiments may be practiced.

FIG. 5 shows an example plurality of devices 500 that may be configured to provide an audio playback experience based on voice control. One having ordinary skill in the art will appreciate that the devices shown in FIG. 5 are for illustrative purposes only, and variations including different and/or additional devices may be possible. As shown, the plurality of devices 500 includes computing devices 504, 506, and 508; network microphone devices (NMDs) 512, 514, and 516; playback devices (PBDs) 532, 534, 536, and 538; and a controller device (CR) 522.

Each of the plurality of devices 500 may be network-capable devices that can establish communication with one or more other devices in the plurality of devices according to one or more network protocols, such as NFC, Bluetooth, Ethernet, and IEEE 802.11, among other examples, over one or more types of networks, such as wide area networks (WAN), local area networks (LAN), and personal area networks (PAN), among other possibilities.

As shown, the computing devices 504, 506, and 508 may be part of a cloud network 502. The cloud network 502 may include additional computing devices. In one example, the computing devices 504, 506, and 508 may be different servers. In another example, two or more of the computing devices 504, 506, and 508 may be modules of a single server. Analogously, each of the computing device 504, 506, and 508 may include one or more modules or servers. For ease of illustration purposes herein, each of the computing devices 504, 506, and 508 may be configured to perform particular functions within the cloud network 502. For instance, computing device 508 may be a source of audio content for a streaming music service.

As shown, the computing device 504 may be configured to interface with NMDs 512, 514, and 516 via communication path 542. NMDs 512, 514, and 516 may be components of one or more "Smart Home" systems. In one case, NMDs 512, 514, and 516 may be physically distributed throughout a household, similar to the distribution of devices shown in FIG. 1. In another case, two or more of the NMDs 512, 514, and 516 may be physically positioned within relative close proximity of one another. Communication path 542 may comprise one or more types of networks, such as a WAN including the Internet, LAN, and/or PAN, among other possibilities.

In one example, one or more of the NMDs 512, 514, and 516 may be devices configured primarily for audio detection. In another example, one or more of the NMDs 512, 514, and 516 may be components of devices having various primary utilities. For instance, as discussed above in connection to FIGS. 2 and 3, one or more of NMDs 512, 514, and 516 may be the microphone(s) 220 of playback device 200 or the microphone(s) 310 of control device 300. Further, in some cases, one or more of NMDs 512, 514, and 516 may be the playback device 200 or control device 300. In an example, one or more of NMDs 512, 514, and/or 516 may include multiple microphones arranged in a microphone array.

As shown, the computing device 506 may be configured to interface with CR 522 and PBDs 532, 534, 536, and 538 via communication path 544. In one example, CR 522 may be a network device such as the playback device 200 of FIG. 2. Accordingly, CR 522 may be configured to provide the controller interface 400 of FIG. 4. Similarly, PBDs 532, 534, 536, and 538 may be playback devices such as the playback device 300 of FIG. 3. As such, PBDs 532, 534, 536, and 538 may be physically distributed throughout a household as shown in FIG. 1. For illustration purposes, PBDs 536 and 538 may be part of a bonded zone 530, while PBDs 532 and 534 may be part of their own respective zones. As described above, the PBDs 532, 534, 536, and 538 may be dynamically bonded, grouped, unbonded, and ungrouped. Communication path 544 may comprise one or more types of networks, such as a WAN including the Internet, LAN, and/or PAN, among other possibilities.

In one example, as with NMDs 512, 514, and 516, CR 522 and PBDs 532, 534, 536, and 538 may also be components of one or more "Smart Home" systems. In one case, PBDs 532, 534, 536, and 538 may be distributed throughout the same household as the NMDs 512, 514, and 516. Further, as suggested above, one or more of PBDs 532, 534, 536, and 538 may be one or more of NMDs 512, 514, and 516.

The NMDs 512, 514, and 516 may be part of a local area network, and the communication path 542 may include an access point that links the local area network of the NMDs 512, 514, and 516 to the computing device 504 over a WAN (communication path not shown). Likewise, each of the NMDs 512, 514, and 516 may communicate with each other via such an access point.

Similarly, CR 522 and PBDs 532, 534, 536, and 538 may be part of a local area network and/or a local playback network as discussed in previous sections, and the communication path 544 may include an access point that links the local area network and/or local playback network of CR 522 and PBDs 532, 534, 536, and 538 to the computing device 506 over a WAN. As such, each of the CR 522 and PBDs 532, 534, 536, and 538 may also communicate with each over such an access point.

In one example, communication paths 542 and 544 may comprise the same access point. In an example, each of the NMDs 512, 514, and 516, CR 522, and PBDs 532, 534, 536, and 538 may access the cloud network 502 via the same access point for a household.

As shown in FIG. 5, each of the NMDs 512, 514, and 516, CR 522, and PBDs 532, 534, 536, and 538 may also directly communicate with one or more of the other devices via communication means 546. Communication means 546 as described herein may involve one or more forms of communication between the devices, according to one or more network protocols, over one or more types of networks, and/or may involve communication via one or more other network devices. For instance, communication means 546 may include one or more of for example, Bluetooth™ (IEEE 802.15), NFC, Wireless direct, and/or Proprietary wireless, among other possibilities.

In one example, CR 522 may communicate with NMD 512 over Bluetooth™, and communicate with PBD 534 over another local area network. In another example, NMD 514 may communicate with CR 522 over another local area network, and communicate with PBD 536 over Bluetooth. In a further example, each of the PBDs 532, 534, 536, and 538 may communicate with each other according to a spanning tree protocol over a local playback network, while each communicating with CR 522 over a local area network, different from the local playback network. Other examples are also possible.

In some cases, communication means between the NMDs 512, 514, and 516, CR 522, and PBDs 532, 534, 536, and 538 may change depending on types of communication between the devices, network conditions, and/or latency demands. For instance, communication means 546 may be used when NMD 516 is first introduced to the household with the PBDs 532, 534, 536, and 538. In one case, the NMD 516 may transmit identification information corresponding to the NMD 516 to PBD 538 via NFC, and PBD 538 may in response, transmit local area network information to NMD 516 via NFC (or some other form of communication). However, once NMD 516 has been configured within the household, communication means between NMD 516 and PBD 538 may change. For instance, NMD 516 may subsequently communicate with PBD 538 via communication path 542, the cloud network 502, and communication path 544. In another example, the NMDs and PBDs may never communicate via local communications means 546. In a further example, the NMDs and PBDs may communicate primarily via local communications means 546. Other examples are also possible.

In an illustrative example, NMDs 512, 514, and 516 may be configured to receive voice inputs to control PBDs 532, 534, 536, and 538. The available control commands may include any media playback system controls previously discussed, such as playback volume control, playback transport controls, music source selection, and grouping, among other possibilities. In one instance, NMD 512 may receive a voice input to control one or more of the PBDs 532, 534, 536, and 538. In response to receiving the voice input, NMD 512 may transmit via communication path 542, the voice input to computing device 504 for processing. In one example, the computing device 504 may convert the voice input to an equivalent text command, and parse the text command to identify a command. Computing device 504 may then subsequently transmit the text command to the computing device 506. In another example, the computing device 504 may convert the voice input to an equivalent text command, and then subsequently transmit the text command to the computing device 506. The computing device 506 may then parse the text command to identify one or more playback commands.

For instance, if the text command is "Play 'Track 1' by 'Artist 1' from 'Streaming Service 1' in 'Zone 1'," The computing device 506 may identify (i) a URL for "Track 1" by "Artist 1" available from "Streaming Service 1," and (ii) at least one playback device in "Zone 1." In this example, the URL for "Track 1" by "Artist 1" from "Streaming Service 1" may be a URL pointing to computing device 508, and "Zone 1" may be the bonded zone 530. As such, upon identifying the URL and one or both of PBDs 536 and 538, the computing device 506 may transmit via communication path 544 to one or both of PBDs 536 and 538, the identified URL for playback. One or both of PBDs 536 and 538 may responsively retrieve audio content from the computing device 508 according to the received URL, and begin playing "Track 1" by "Artist 1" from "Streaming Service 1."

One having ordinary skill in the art will appreciate that the above is just one illustrative example, and that other implementations are also possible. In one case, operations performed by one or more of the plurality of devices 500, as described above, may be performed by one or more other devices in the plurality of device 500. For instance, the conversion from voice input to the text command may be alternatively, partially, or wholly performed by another device or devices, such as NMD 512, computing device 506, PBD 536, and/or PBD 538. Analogously, the identification of the URL may be alternatively, partially, or wholly performed by another device or devices, such as NMD 512, computing device 504, PBD 536, and/or PBD 538.

f. Example Network Microphone Device

Figure 6:
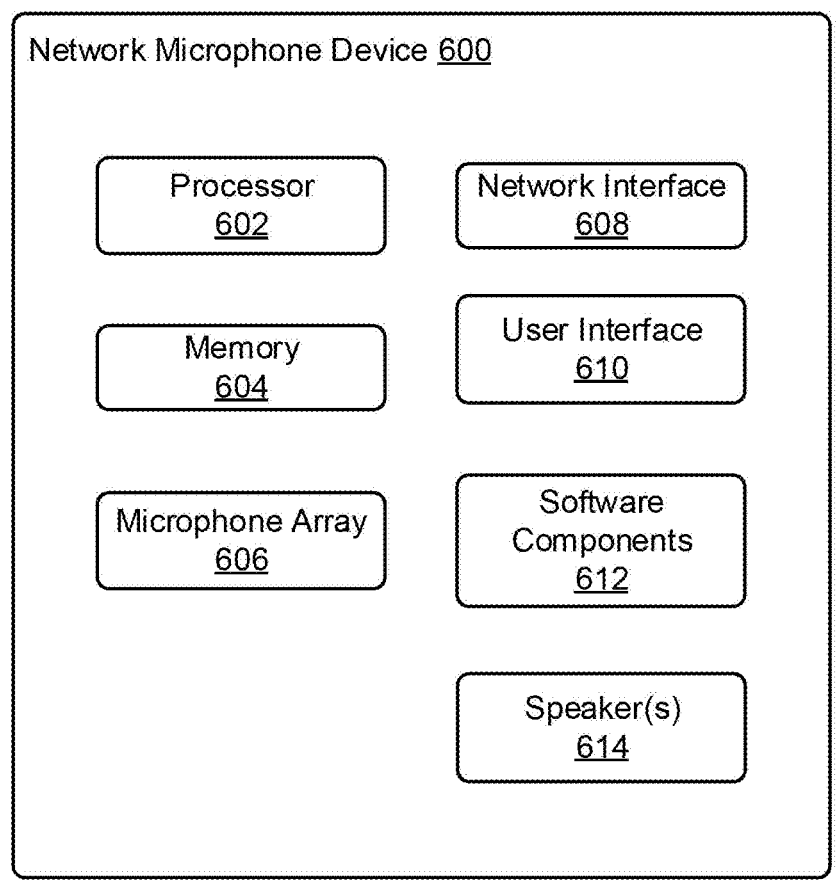
FIG. 6 shows a functional block diagram of an example network microphone device.

FIG. 6 shows a function block diagram of an example network microphone device 600 that may be configured to be one or more of NMDs 512, 514, and 516 of FIG. 5. As shown, the network microphone device 600 includes a processor 602, memory 604, a microphone array 606, a network interface 608, a user interface 610, software components 612, and speaker(s) 614. One having ordinary skill in the art will appreciate that other network microphone device configurations and arrangements are also possible.

For instance, network microphone devices may alternatively exclude the speaker(s) 614 or have a single microphone instead of microphone array 606.

The processor 602 may include one or more processors and/or controllers, which may take the form of a general or special-purpose processor or controller. For instance, the processing unit 602 may include microprocessors, microcontrollers, application-specific integrated circuits, digital signal processors, and the like. The memory 604 may be data storage that can be loaded with one or more of the software components executable by the processor 602 to perform those functions. Accordingly, memory 604 may comprise one or more non-transitory computer-readable storage mediums, examples of which may include volatile storage mediums such as random access memory, registers, cache, etc. and non-volatile storage mediums such as read-only memory, a hard-disk drive, a solid-state drive, flash memory, and/or an optical-storage device, among other possibilities.

The microphone array 606 may be a plurality of microphones arranged to detect sound in the environment of the network microphone device 600. Microphone array 606 may include any type of microphone now known or later developed such as a condenser microphone, electret condenser microphone, or a dynamic microphone, among other possibilities. In one example, the microphone array may be arranged to detect audio from one or more directions relative to the network microphone device. The microphone array 606 may be sensitive to a portion of a frequency range. In one example, a first subset of the microphone array 606 may be sensitive to a first frequency range, while a second subset of the microphone array may be sensitive to a second frequency range. The microphone array 606 may further be arranged to capture location information of an audio source (e.g., voice, audible sound) and/or to assist in filtering background noise. Notably, in some embodiments the microphone array may consist of only a single microphone, rather than a plurality of microphones.

The network interface 608 may be configured to facilitate wireless and/or wired communication between various network devices, such as, in reference to FIG. 5, CR 522, PBDs 532-538, computing device 504-508 in cloud network 502, and other network microphone devices, among other possibilities. As such, network interface 608 may take any suitable form for carrying out these functions, examples of which may include an Ethernet interface, a serial bus interface (e.g., FireWire, USB 2.0, etc.), a chipset and antenna adapted to facilitate wireless communication, and/or any other interface that provides for wired and/or wireless communication. In one example, the network interface 608 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on).

The user interface 610 of the network microphone device 600 may be configured to facilitate user interactions with the network microphone device. In one example, the user interface 610 may include one or more of physical buttons, graphical interfaces provided on touch sensitive screen(s) and/or surface(s), among other possibilities, for a user to directly provide input to the network microphone device 600. The user interface 610 may further include one or more of lights and the speaker(s) 614 to provide visual and/or audio feedback to a user. In one example, the network microphone device 600 may further be configured to playback audio content via the speaker(s) 614.

III. Example Network Device(s) for Determining Lifetime Estimate

An audio playback device typically has acoustic components for converting electrical signals indicative of source audio content such as music into audible sound. Typically, the acoustic components may include a transducer and/or associated soft components soft (e.g., elastic) components of the transducer with a finite lifetime. A lifetime of the acoustic component of the audio playback device may be how long the acoustic component of the audio playback device operates before failing. Failure may be defined as when the audio component no longer outputs audio sound, outputs distorted audio sound, and/or outputs audio sound not reflective of the source audio content input to the acoustic component.

Figure 7:
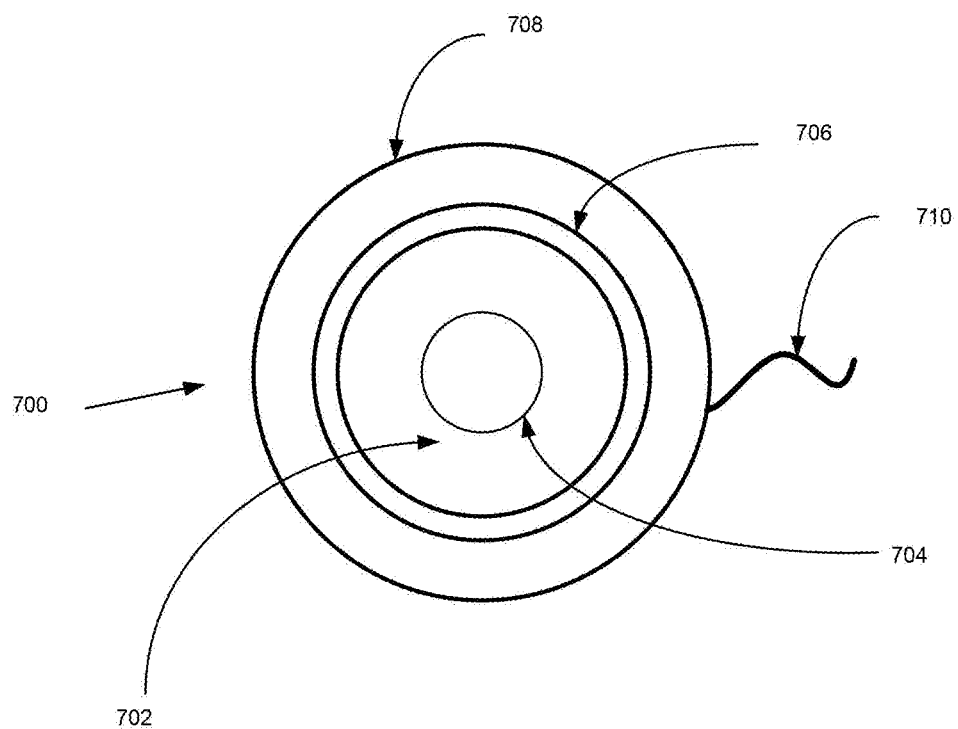
FIG. 7 shows example components of an example transducer of an audio playback device.

FIG. 7 is an illustration of example components that make up a transducer 700 (herein also referred to as a speaker). The transducer may be, for example, a woofer, tweeter, or mid-range speaker. The transducer 700 may include various components including a diaphragm 702, dust cap 704, surround 706, basket 708, and tinsel wire 710. Of the components of the illustrated transducer 700, the diaphragm 702, dust cap 704, surround 706, and tinsel wire 710 may be considered soft components with a finite lifetime.

The diaphragm 702 is typically responsible for pushing air which in turn generates audible sound. The more surface area that the diaphragm 702 has, the more air that it can Many diaphragms are made from types of treated paper.

The diaphragm 702 moves air in response to movement of a voice coil (not shown). The voice coil may be a coil of wire that changes polarity when an electrical current runs through the coil. The coil, at rest, may sit between a magnet's polar north and south and when the polarity of the coil changes, it repels the polarity of the magnet and moves. This movement in turn causes the diaphragm 702 to move. The diaphragm 702 may be designed to be light, strong, and well dampened. If the diaphragm 702 is too heavy, it may be slow to respond to the movement of the voice coil. If the diaphragm 702 is weak and/or not well dampened, the diaphragm 702 may color the sound with harmonics or resonances in an undesirable way.

The dust cap 704 may be a small dome (or inverted dome) centered within the diaphragm 702. Underneath is a center of the voice coil. The dust cap 704 protects inner mechanics (such as the voice coil) from small dust particles and other contamination. The dust cap 704 can also contribute to structural integrity of the voice coil and/or the diaphragm 702.

The basket 708 holds the components of the transducer together. The basket 708 is typically made from a ridged material such as metal or fiberglass. Additionally, the basket 708 may include a flange that allows the transducer to be mounted to a baffle of some kind.

The surround 706 attaches an outer edge of the diaphragm 702 to the basket 708. The surround 768 may serve a variety of functions including sealing the diaphragm 702 to the basket 708, centering the diaphragm 702 within the basket 708, and allowing free piston-like motion of the diaphragm 702. Surrounds 706 are usually made of butyl rubber, foam, and sometimes cloth.

The tinsel wires 710 are leads that carry electrical signals associated with source audio content from an amplifier to the voice coil. The tinsel wire may be made of copper or aluminum and be designed to flex in response to movement of the diaphragm 702.

An audio playback device may have various signal processing settings. Some settings may be configurable by a user such as volume, loudness, base, treble, and frequency equalization. Other settings may be defined by a manufacturer such as how far the diaphragm of the transducer can linearly travel from its resting position or filters that are applied to audio content prior to the audio playback device playing back the audio content. Different signal processing settings may place different stresses on the soft components of the transducer. The stress results in fatigue and progressive failure of the soft component at a microscopic level, e.g., weakening of molecule bonds at molecular defect sites. In this regard, the signal processing settings of the audio playback device may affect the lifetime of the acoustic component of the audio playback device.

A manufacturer of an audio playback device may determine the lifetime of an acoustic component of the audio playback device when configured with certain signal processing settings. Typically, the determination may have been made through traditional reliability testing which involves mechanically stressing acoustic components of an audio playback device for long periods (e.g., 120 days) in a test environment such as a laboratory. There may be a need at some later time to change the signal processing settings for the audio playback device. For example, the manufacturer may want to change the signal processing settings to improve audio quality of its audio playback devices. A manufacturer may want to know whether the changed signal processing settings may increase or decrease a lifetime of the acoustic component of the audio playback device without having to mechanically stress acoustic components of an audio playback device implementing the changed signal processing setting for the long periods of time.

Figure 8:
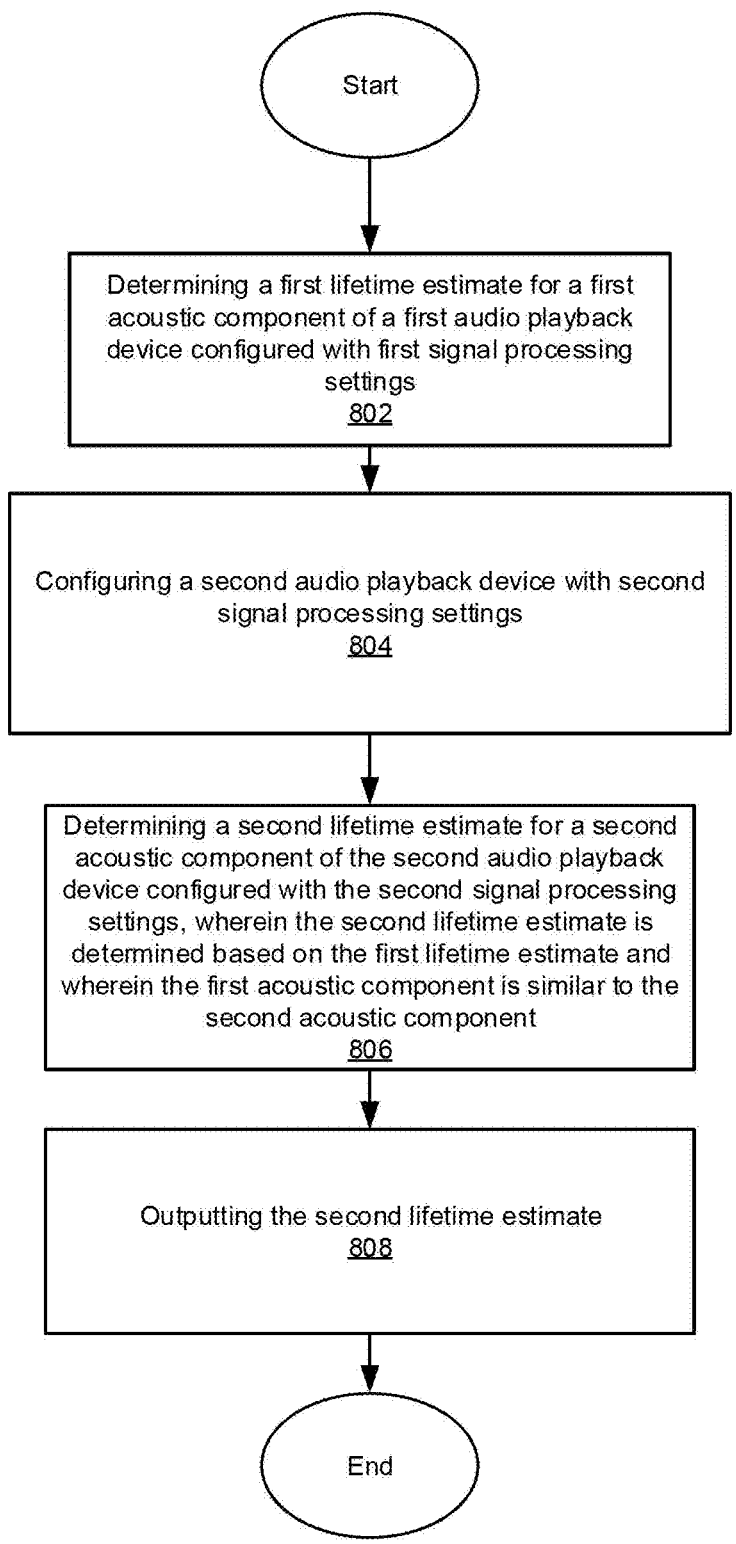
FIG. 8 shows an example flow diagram of functions associated with determining a lifetime estimate of an acoustic component of an audio playback device when signal processing settings of the audio playback device are changed.

FIG. 8 is a flow diagram of functions associated with determining a lifetime estimate of an acoustic component of an audio playback device when the signal processing settings of the audio playback device are changed. The lifetime estimate of the acoustic component can be determined without needing to perform the traditional reliability testing again. Instead, the lifetime estimate of the acoustic component determined before the signal processing settings were changed can be used to determine the lifetime estimate of the acoustic component when the signal processing settings of the audio playback device are changed.

Methods and the other process disclosed herein may include one or more operations, functions, or actions. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the methods and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, each block in the figures may represent circuitry that is wired to perform the specific logical functions in the process.

In one example, the disclosed functions for determining the lifetime estimate may be at least partially performed by the audio playback device 200. In another example, the disclosed functions for determining the lifetime estimate may be at least partially performed by the computing device 504-508. In yet another example, functions for determining the lifetime estimate may be at least partially performed by the control device 300. In another example, functions determining the lifetime estimate may be at least partially performed by an NMD 512-516. Other arrangements are also possible.

At 802, a first lifetime estimate may be determined for a first acoustic component of a first audio playback device when configured with first signal processing settings. At 804, a second audio playback device may be configured with second signal processing settings. At 806, a second lifetime estimate may be determined for a second acoustic component of the second audio playback device when configured with the second signal processing settings, wherein the second lifetime estimate is determined based on the first lifetime estimate. At 808, the second lifetime estimate may be output.

As used herein, the first audio playback device when configured with first signal processing settings and the second audio playback device when configured with the second signal processing settings may refer to the same physical audio playback device but with different signal processing settings. Alternatively, the first audio playback device when configured with first signal processing settings and the second audio playback device when configured with the second signal processing settings may refer to different physical audio playback devices of a similar model and/or configuration with the different signal processing settings. Also as used herein, the first acoustic component and the second acoustic component may refer to the same physical acoustic component. Alternatively, the first acoustic component and the second acoustic component may refer to different physical acoustic components of a similar model and/or configuration.

Starting at 802, a first lifetime estimate for a first acoustic component of a first audio playback device configured with first signal processing settings may be determined. The first lifetime estimate may be determined by performing traditional reliability tests on the acoustic component of the audio playback device. The traditional reliability tests may involve mechanically stressing the acoustic component. The mechanical stressing may take the form of inputting an electrical signal representative of test source audio content, e.g., noise, music, and/or noise and music, which is transduced into a mechanical motion by the acoustic component. In turn, a cyclic loading and unloading of stress may be applied to the acoustic component. The number of cycles may be monitored until the acoustic component of the audio playback device fails (e.g., no longer outputs audio sound, outputs distorted audio sound, and/or outputs audio sound not reflective of audio content).

Statistics may be calculated to characterize a failure rate of the acoustic component of the audio playback device. The above reliability test may be run on a plurality of similarly configured audio playback devices with the same acoustic component and the same signal processing settings. The plurality of similarly configured audio playback devices may each be playing back the same test source audio content at a predetermined volume (e.g., full volume also known as a "full power test"). For example, 36 playback devices may be operated at full volume. One device may fail after 63 days of operation, two devices may fail at 78 days of operation, three devices may fail at 123 days of operation, and four devices may fail at 158 days of operation. The failure may be, for example, that a tinsel wire breaks or the surround of the speaker tears. Based on such statistics, a continuous probability distribution that characterizes the failure rate of the audio playback device may be determined.

A Weibull distribution is an example continuous probability distribution used in failure analysis. A mathematical relationship for the Weibull probability distribution is given by:

$$y = ab^{-1/a} x^{a-1} e^{-(x/b)a} \quad (1)$$

where x is an independent variable such as number of cycles, y is the probability distribution function, a is shape parameter and b is a scale parameter. a and b may characterize a failure rate statistically and in particular b may indicate a lifetime estimate of the audio playback device under the operating conditions of the traditional reliability test. The lifetime estimate based on the failures in the example described above is b=437 days.

Figure 9:
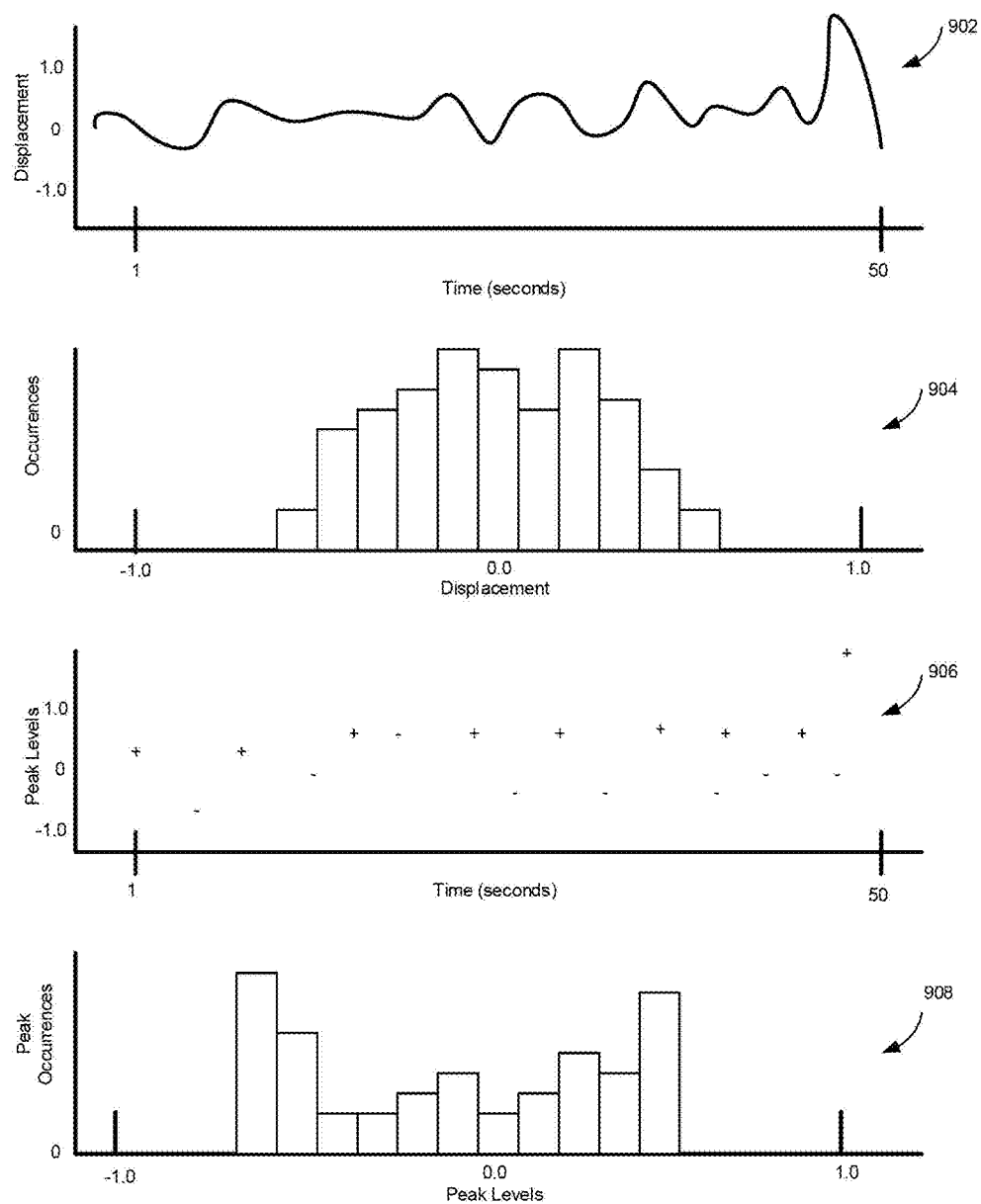
FIG. 9 shows various example statistics collected during a reliability test.

FIG. 9 shows various other statistics that may be collected during the reliability test. The various other statistics, though not needed to determine a and b, may also be indicative of a lifetime of the acoustic component of the audio playback device.

One statistic may be a real time displacement of an acoustic component such as the diaphragm of the speaker over a period of time. The displacement may be determined by a position measurement system (e.g., laser-based system) where 0 may represent a resting position of the acoustic component. The real-time displacement may be plotted in a graph 902 which shows the displacement of the acoustic component over time. Further, the graph 902 may be used to generate a corresponding histogram 904 of real-time position data. The histogram 904 may show a distribution of occurrences of various displacements of the acoustic component. For the case of music or noise, the histogram 904 may take a shape of a bell curve.

Another statistic may be positive and negative amplitude peaks associated with a cyclic stress over a period of time. The positive and negative amplitude peaks may correspond to the high point and low point of a cyclic movement of an acoustic component of the audio playback device corresponding to graph 902. Graph 906 shows a plot of the positive and negative peaks. Over time, the "+" plotted in graph 906 may represent a positive peak and the "−" plotted in graph 906 may represent a negative peak. Further, the graph 906 may be used to generate a corresponding histogram 908 of the positive peaks and negative peaks. The histogram 908 may show a distribution of occurrences of positive and negative peaks associated with movement of the acoustic component.

One or more of the graphs 902, 906 and histograms 904, 908 determined for the signal processing setting may be used to calculate an average cycle time and average cycle stress amplitude of the acoustic component when the audio playback device is configured with the signal processing settings.

The average cycle time may be a ratio of a period of time and a number of positive peaks in a period of time shown by graph 906. The period of time may be 30 seconds. A lower average cycle time may indicate that the acoustic component is being cycled more and component will have a shorter lifetime. Conversely, a higher average cycle time may indicate that the acoustic component is being cycled less and the acoustic component will have a longer lifetime.

The cyclic stress average amplitude may be an average of cyclic stress amplitudes shown in the graph 906 or histogram 908 over the period of time. A smaller cyclic stress average amplitude indicates that a longer lifetime of the acoustic component and a larger cyclic stress average indicates a shorter lifetime of the acoustic component.

Calculating the average of the cyclic stress amplitude where each cyclic stress amplitude is uniformly weighted assumes that fatigue damage of the acoustic component scales linearly with stress amplitude. But if a fatigue-life curve is known, then a cyclic stress amplitude may be weighted based on the fatigue life curve such that higher cyclic stress amplitude may be more fatiguing and a lower cyclic stress amplitude may be less fatiguing.

Figure 10:
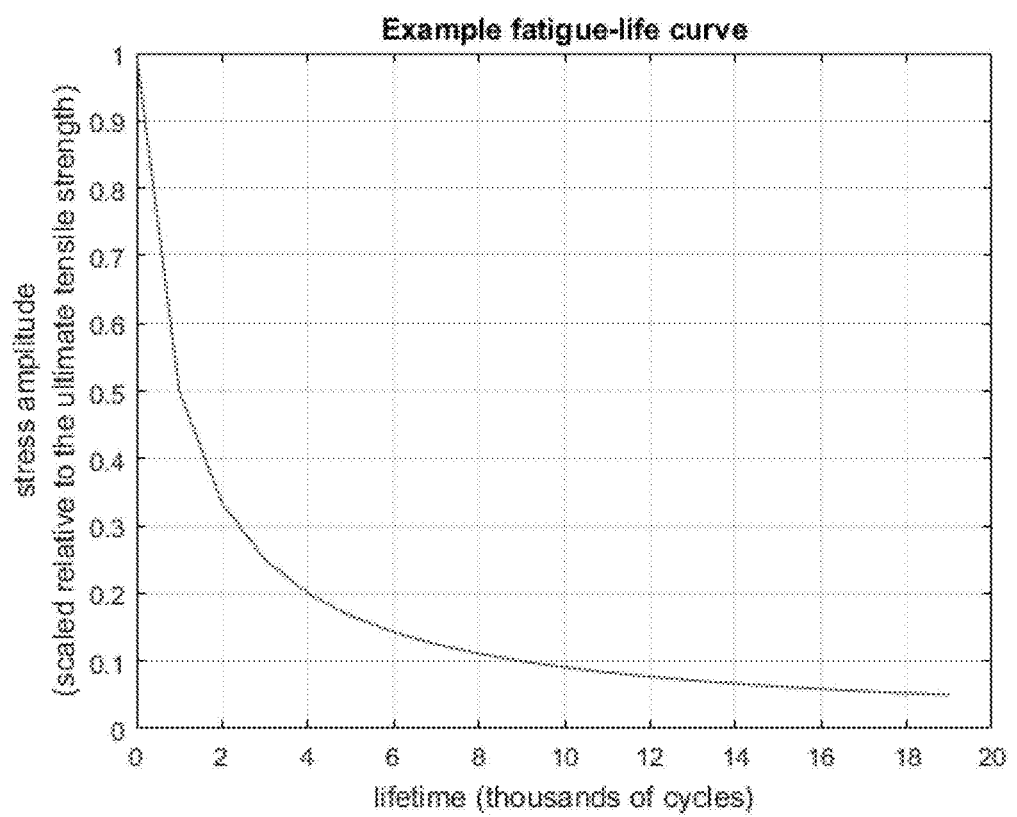
FIG. 10 shows an example fatigue life curve.

FIG. 10 shows an example fatigue life curve. The fatigue life curve may define a relationship between lifetime of an acoustic component of the audio playback device and stress amplitude. The fatigue life curve may be determined by a material testing machine configured to apply different cyclic stress amplitudes to an acoustic component and record a number of cycles until the acoustic component fails. The fatigue life curve can be built up by testing at a number of different cyclic stress amplitudes. The fatigue life curve is a generally monotonically decreasing curve with a peak value of 1 cycle which is an ultimate tensile strength of the acoustic component in question.

The lifetime estimate determined at 802 and the statistics and parameters associated with the acoustic component of audio playback device when configured with the first signal processing settings may be performed as part of the traditional reliability testing and then stored in a network device such as the computing device, NMD, and/or audio playback device. In this case, determining the lifetime estimate at 802 and associated statistics and parameters may involve simply retrieving the stored lifetime estimate and associated statistics and parameters from the network device rather than performing the disclosed measurements again.

A manufacturer may perform the traditional reliability test to determine an estimated lifetime of an acoustic component of the audio playback device when the audio playback device configured with the first signal processing settings. Additionally, the manufacturer may determine the described statistics and parameters of FIG. 9 for the audio playback device configured with the first signal processing settings. However, at some later time, the manufacturer may want to change the signal processing settings of the audio playback device. The changed signal processing settings may render the previously estimated lifetime inapplicable. The disclosed embodiments enable determining this change without needing to conduct traditional reliability testing again.

At 806, a second lifetime estimate may be determined for a second acoustic component of a second audio playback device when configured with the second signal processing settings. The second acoustic component and the second audio playback device may be the same or physically different audio playback device and/or acoustic component as used when the first lifetime estimate was determined at 802 so long as they are substantially similar (e.g., same model and/or configuration). The second lifetime estimate may be determined based on the first lifetime estimate.

Figure 11:
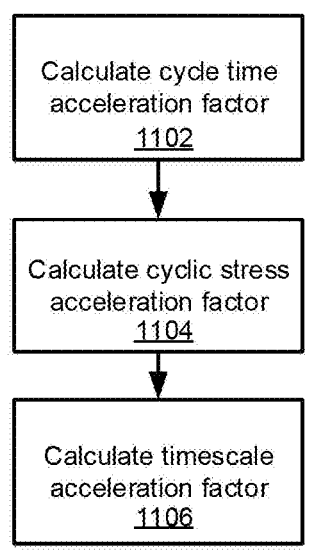
FIG. 11 shows another example flow diagram of functions associated with determining a lifetime estimate of an acoustic component of an audio playback device when signal processing settings of the audio playback device are changed.

FIG. 11 is a flow chart of example functions associated with determining the second lifetime estimate. The functions described in FIG. 11 may be performed by the audio playback device itself or one or more of the computing device, NMD, and/or another audio playback device.

At 1102, a cycle time acceleration factor may be calculated. The cycle time acceleration factor $A_{ct}$ may be ratio of an average cycle time of an acoustic component of the audio playback device when configured with second signal processing settings to the average cycle time of the acoustic component of the audio playback device when configured with first signal processing settings. The average cycle time of an acoustic component of the audio playback device when configured with second signal processing settings may be determined in a manner similar to that described above for determining the average cycle time of an acoustic component of the audio playback device when configured with the first signal processing settings.

At 1104, a cyclic stress acceleration factor may be calculated. The cyclic stress acceleration factor $A_{cs}$ may be ratio of an average cyclic stress of an acoustic component of the audio playback device when configured with second signal processing settings to the average cyclic stress of the acoustic component of the audio playback device when configured with first signal processing settings. The average cyclic stress of an acoustic component of the audio playback device when configured with second signal processing settings may be determined in a manner similar to that described above for determining the average cyclic stress of an acoustic component of the audio playback device when configured with the first signal processing settings.

Relationships between the acceleration factors may indicate how the estimated lifetime of the acoustic component of the audio playback device changes with the new signal processing settings.

If $A_{cs}$ is less than 1, then the new signal processing settings are less stressful than the previous signal processing settings. If $A_{ct}$ is less than 1, then the new signal processing settings cause the acoustic component to cycle faster than the previous signal processing settings. Then, if $A_{ct}/A_{cs}$ is less than 1, then the new signal processing settings decrease a lifetime of the acoustic component of the audio playback device.

If $A_{cs}$ is less than 1, then the new signal processing settings are less stressful than the previous signal processing settings. If $A_{ct}$ is greater than 1, then the new signal processing settings cause the acoustic component to cycle slower than the previous signal processing settings. It follows that the new signal processing settings do not decrease a lifetime of the acoustic component of the audio playback device.

If $A_{cs}$ is greater than 1, then the new signal processing settings are more stressful than the previous signal processing settings. If $A_{ct}$ is less than 1, then the new signal processing settings cause a faster cycling than the previous signal processing settings. It follows that the new signal processing settings decrease a lifetime of the acoustic component of the audio playback device.

If $A_{cs}$ is greater than 1, then the new signal processing settings are more stressful than the previous signal processing settings. If $A_{ct}$ is greater than 1, then the new signal processing settings cause the acoustic component to cycle slower than the previous signal processing settings. Then, if $A_{ct}/A_{cs}$ is less than 1, the new signal processing settings decrease a lifetime of the acoustic component of the audio playback device.

At 1106, a timescale acceleration factor may be calculated. The timescale acceleration factor may be a ratio of the first lifetime estimate (e.g., indicated by b of the Weilbull parameter) to an indication of usage of the second audio playback device. The second audio playback device may be used by a consumer. In some embodiments, the indication of usage may be how long the second audio playback device is used by a consumer, e.g., used for 3 hours in a day, 12 hours in a week. In other embodiments, the indication of usage may take the form of a duty cycle. The duty cycle may be a ratio expressing a percentage of usage of the audio playback device by the consumer within a duration of time, e.g., a day, week, month. For instance, if the audio playback device is used on average three hours a day by a consumer, then the duty cycle is 3/24 or 12.5%. The audio playback device may be arranged with a timer to determine the indication of usage for the audio playback device.

In one embodiment, the indication of usage from a particular audio playback device in the media network may be used to calculate the timescale acceleration factor. In this regard, the audio playback device may be arranged to provide an indication of usage to a network device calculating the timescale acceleration factor, e.g., computing device, NMD, or another audio playback device, via one or more of the networks 546, 502. This indication of usage may be provided periodically by the audio playback device. Alternatively, the network device calculating the timescale acceleration factor may receive indications of usage from a plurality of audio playback devices and determine an average indication of usage (or some other measure based on the indications of usage of the plurality of audio playback devices). The network device may then calculate the timescale acceleration factor based on this average indication of usage.

The following expression may be then evaluated to determine the lifetime estimate of the audio playback device based on the second signal processing settings.

$$t_{field} >= (A_{scale})*(A_{ct}/A_{cs}) \quad (2)$$

where $A_{ct}$ is the cycle time acceleration factor, $A_{cs}$ is the cyclic stress acceleration factor, and $A_{scale}$ is the timescale acceleration factor. The expression is an inequality with the assumption that fatigue damage scales with the time based factors in a linear fashion.

Figure 12:
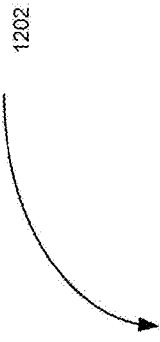
FIG. 12 shows example values of cyclic parameters and acceleration factors determined in accordance with FIG. 11.
Figure 12:
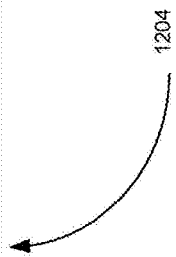

FIG. 12 shows example values of cyclic parameters and acceleration factors determined in accordance with FIG. 11 and corresponding the lifetime estimates.

As shown in table 1202, the cyclic parameters and acceleration factors may take the form of cyclic stress amplitudes, cycle times, cyclic stress accelerator factors, and timescale acceleration factors (i.e., cycle time acceleration factor). The cyclic parameters and acceleration factors may be determined by setting the volume of the audio playback device to a particular volume level (e.g., 20 or 50) and determining the cyclic parameters and acceleration factors in accordance with FIGS. 8-11.

Table 1204 shows example lifetime estimates calculated based on the cyclic parameters and acceleration factors of table 1202. A ratio may be calculated based on the timescale acceleration factor and the cyclic stress acceleration factor. In embodiments, this ratio may be multiplied by the ratio of the estimated lifetime of the audio playback device that accounts for the duty cycle of the playback device. The result is an estimated product life based on the new signal processing settings. The lifetime estimate may be calculated for a particular volume. The lifetime estimate at different volumes may provide a better overall lifetime estimate of the audio playback device. For instance, if an average volume of audio played on an audio playback device is 20, then the lifetime of the audio playback device with the changed signal processing settings of 130 years may be acceptable. On the other hand, if an average volume of audio played on an audio playback device is 80, then the lifetime of the audio playback device with the changed signal processing settings of 8 years may not be acceptable.

FIG. 13 illustrates an example of a volume setting matrix 1300 which may be used to determine an average volume setting of the audio playback device. The volume setting matrix 1300 may have an indication of a volume setting and indication of duration at the volume setting. The volume setting may range from 0 to 100, where 0 is no audio being output by the audio playback device and 100 may be audio output by the playback device at maximum volume. The audio playback device may have a timer which tracks a duration of how long an audio playback device operates at a particular volume. The duration in the volume setting matrix may be indicated as an absolute number, relative number, and/or percentage. For example, the volume matrix may indicate that the audio playback device plays audio at a volume of 80 for 10% of the time and plays audio at a volume of 30% for 8% of the time. The volume matrix may show the durations in time such as 1200 minutes and/or based on an average such as 120 minutes per day. Other arrangements are also possible.

The volume settings may continuously range from 0 to 100. In some embodiments, the volume setting matrix may show volume settings for all volume settings in the range of 0 to 100. In other embodiments, the volume setting matrix may only show durations for a subset of the volume settings such as those illustrated in 1300. For example, the volume settings that are shown may be for those durations that exceed a predefined threshold.

The audio playback device may store the volume matrix locally and/or send the volume matrix to a computing device, other network device, and/or another audio playback device. Additionally, or alternatively, the audio playback device may send the durations of how long an audio playback device operates at a particular volume to a computing device, other network device, and/or another audio playback device and the computing device, other network device, and/or another audio playback device may then consolidate the durations into the volume setting matrix. The average volume setting of an audio playback device may be computed based on the durations that the audio playback device plays audio at the different volumes.

Referring back to FIG. 12, table 1202 also shows a maximum displacement of an acoustic component of the audio playback device. The maximum displacement may be determined from one or more of the graphs/histograms of FIG. 9. In some embodiments, the maximum displacement may be used to make a "quick" determination of acceptability of the changed signal processing settings without having to estimate the lifetime of the audio playback device with changed signal processing settings. The maximum displacement may be compared to a threshold limit. If the displacement is much greater than the threshold or equal to the threshold, then the new signal processing settings may be unacceptable. If the displacement is much less than the threshold or equal to the threshold, then the new signal processing settings may be acceptable. With an indication of an acceptable signal processing setting, the determination of the lifetime estimate may proceed in accordance with equation (2) above.

The second lifetime estimate may be output at 808. The second lifetime estimate may be output to a user interface of a network device and/or communicated to another network device.

Further, a comparison of the first lifetime estimate and the second lifetime estimate may facilitate a determination of whether changing the signal processing settings of the audio playback device will negatively impact a lifetime of an acoustic component of the audio playback device.

For example, the lifetime estimate of an acoustic component of the audio playback device when configured with first signal processing setting may be higher than the lifetime estimate of the acoustic component of the audio playback device when configured with second signal processing setting. The decrease may indicate that the new signal processing settings are unacceptable.

On the other hand, the new signal processing settings may still be acceptable even though the lifetime estimate decreased. For instance, if the lifetime estimate decreases from 130 years to 100 years, the new signal processing settings may still be acceptable. This may be the case if the acoustic component of the audio playback device is not expected to be in operation for so long anyways. For instance, the audio playback device may not be expected to be used for that long, or alternatively, one or more other components of the audio playback device are expected to fail before the end of the acoustic component lifetime estimate. But if the lifetime estimate decreases from 10 years to 2 years, the new signal processing settings may not be acceptable because the lifetime of the acoustic component has decreased so low that it may fall below an expected lifetime of the acoustic component and further, the expected lifetime of the audio playback device.

Aspects of the disclosed embodiments may also be used to determine whether new signal processing setting should be applied to an audio playback device to extend a lifetime of the acoustic component of audio playback device. The determination may be based on an indication of usage of the audio playback device. The indication of usage may be stored locally on the audio playback device. The audio playback device may be further arranged to provide an indication of usage to the network device, e.g., computing device, NMD, or another audio playback device, via one or more of the networks 546, 502, to determine whether new signal processing setting should be applied to an audio playback device to extend a lifetime of the acoustic component of audio playback device.

In one example, the indication of usage may be an amount of time the audio playback device operates at particular volume settings. The indication of usage may take the form of the volume setting matrix which indicate how much time the audio playback device plays audio content at different volumes.

In another example, the indication of usage may be how long the audio playback device is used. The duration may be indicated as an absolute or relative number e.g., used for 3 hours or 3 hours in a day, 12 hours or 12 hours in a week.

In yet another example, the indication of usage may take the form of a duty cycle. The duty cycle may be a ratio expressing a percentage of usage of the audio playback device within a duration of time, e.g., a day, week, month. For instance, if a product is used on average three hours a day, then the duty cycle is 3/24 or 12.5%.

The indication of usage may be used to determine whether signal processing settings for that audio playback device should be changed to extend a lifetime of the audio playback device.

Figure 14:
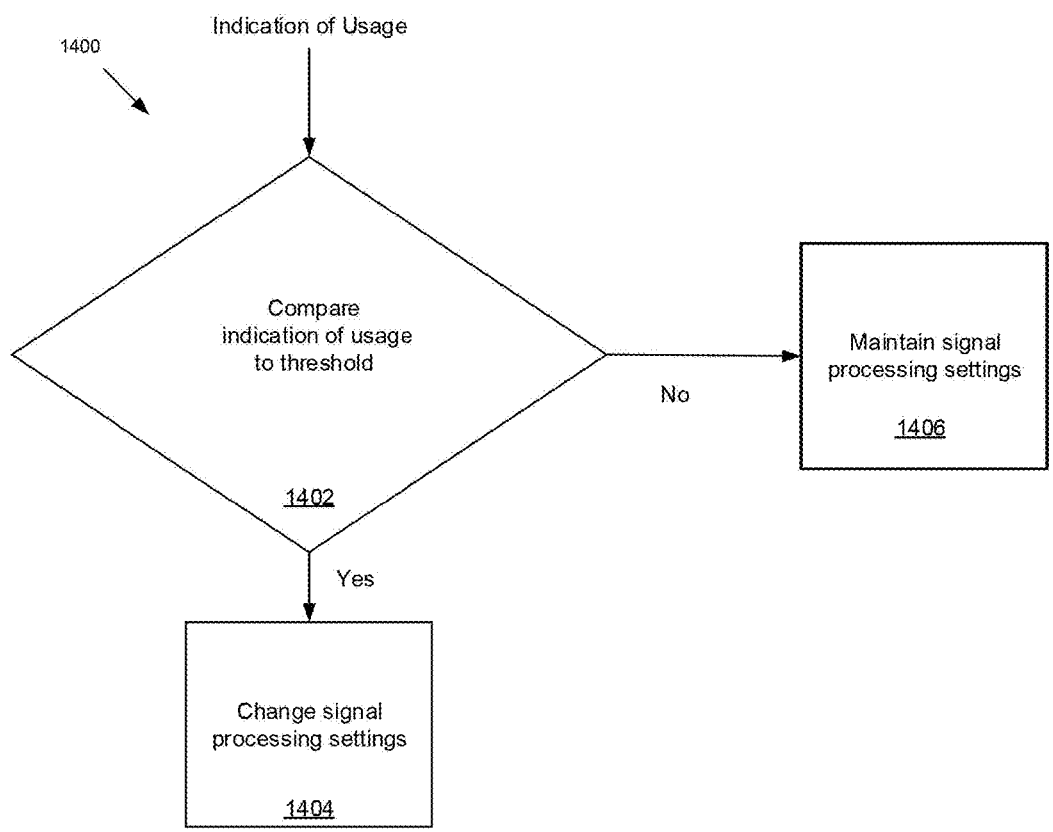
FIG. 14 shows a flow diagram of functions associated with determining whether to change signal processing settings of the audio playback device.

FIG. 14 shows a flow diagram 1400 of functions associated with determining whether to change the signal processing settings of the audio playback device. The signal processing settings may be changed based on the indication of usage. The functions of the flow diagram 1300 may be performed by an audio playback device, a computing device, an NMD, another audio playback device, and combinations thereof.

At 1402, the indication of usage may be compared to one or more thresholds. The indication of usage may be a duration and/or duty cycle. If a respective threshold is crossed indicating that the duration and/or duty cycle is unacceptable, then the signal processing settings of the audio playback device may be changed at 1404 to extend the lifetime of the acoustic component of the audio playback device. For example, signal processing settings which increase a lifetime of an acoustic component may be determined in accordance with FIGS. 8 and 11. If the respective threshold is not crossed indicating that the duration and/or duty cycle is acceptable, then at 1406 the signal processing settings of the audio playback device may not be changed.

Additionally, or alternatively, the indication of usage may be how long audio content is played back by the audio playback device at a particular volume. The volume matrix may provide this indication. If a threshold is crossed indicating that the time is unacceptable, then at the signal processing settings of the audio playback device may be changed at 1404 to extend the lifetime of the acoustic component of the audio playback device. The signal processing settings which increase a lifetime of an acoustic component may be determined in accordance with FIGS. 8 and 11. If the threshold is not crossed indicating that the time is acceptable, then at 1406 the signal processing settings of the audio playback device may not be changed. The threshold for each volume may be the same or different.

Still additionally, or alternatively, a function based on the various indications of usage may be compared to a threshold. If a threshold is crossed, then at the signal processing settings of the audio playback device may be changed at 1404 to extend the lifetime of the acoustic component of the audio playback device. If the threshold is not crossed, then at 1406 the signal processing settings of the audio playback device may not be changed.

The threshold(s) used at 1402 may be selected based on an analysis of the usage of audio playback devices know to have failed. The reason that the audio playback devices may have failed was because the usage was beyond what the audio playback device with current signal processing settings was designed for. Manufacturers of the audio playback device may be able to conduct this analysis through review of failures of audio playback devices. The audio playback devices may report periodically usage to a computing device. The usage of the failed device prior to failure can be analyzed. For example, an average usage may be determined for a plurality of audio playback device that have failed. This usage (associated with failure) may be used to establish a threshold such that any usage above the threshold may indicate that a playback device may be prone to failure without a change in a signal processing setting. The threshold may be chosen based on the usage, such as 10% below an average usage across the plurality of audio playback device that have failed so as to make signal processing setting changes before the audio playback device fails.

The following an example of the application of the steps recited in FIG. 14 with the example volume setting matrix 1300 shown in FIG. 13.

In one example, a threshold for usage for a particular model audio playback device may set to 30% at a volume setting of 20. The threshold of 30% indicates that if the usage of the audio playback device exceeds 30%, the audio playback device may be prone to failure. This threshold may have been set as a result of the manufacturer seeing increased failures of audio playback devices at this usage. The audio playback device associated with the volume setting matrix 1300 may have a usage of 40% at the volume setting of 20. The usage indicated by 1300 exceeds the threshold. As a result, the audio playback device may be prone to failure. The signal processing settings of the audio playback device may be adjusted to increase a lifetime of the acoustic component of the audio playback device.

In another example, a threshold for usage for a particular model audio playback device may be set to 60% at a volume setting of 20. The threshold of 60% indicates that if the usage of the audio playback device exceeds 60%, the audio playback device may be prone to failure. Again, this threshold may have been set as a result of the manufacturer seeing increased failures of audio playback devices at this usage. The audio playback device associated with the volume setting matrix 1300 may have a usage of 40% at the volume setting of 20. The usage indicated by 1300 does not exceed the threshold. As a result, the audio playback device may not be prone to failure. The signal processing settings of the audio playback device may be maintained.

In yet other examples, respective thresholds may be defined for a plurality of volumes and the usage at each volume may be compared to the respective threshold. The signal processing setting of the audio playback device may be changed depending on which and/or how many respective thresholds are exceeded for the usage at each volume. Other arrangements are also possible.

The embodiments described above are directed to changing signal processing settings based on stress placed on acoustic components. The acoustic components which are stressed may be associated with, for example, one or more of a woofer, tweeter, or mid-range speaker.

Additionally, acoustic components of an audio playback device may fatigue for reasons other than or in addition to stress. For instance, presence of ultraviolet light, temperature level, and humidity level may result in fatigue of the acoustic components. Such other types of fatigue may also be exercised in accordance with the disclosed embodiments to determine changes in an estimated lifetime of the audio playback device.

IV. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

I claim:

1. A method comprising:
   receiving a first lifetime estimate for a first type of acoustic component included in a first set of playback devices that are each configured to play back audio content with first signal processing settings that govern a manner in which each of the first set of playback devices outputs audio,
   wherein the first lifetime estimate is determined by mechanically stressing the first type of acoustic component of each of the first set of playback devices by operating each of the first set of playback devices at a predetermined volume;
   after a second playback device having a given acoustic component of a second type has been configured to play back audio content with second signal processing settings that govern a manner in which the second playback device outputs audio, receiving one or more statistics associated with movement of the given acoustic component of the second type that occurred while the second playback device played back the audio content with the second signal processing settings;
   determining a second lifetime estimate for the given acoustic component of the second type based on the one or more statistics associated with the movement of the given acoustic component of the second type and the first lifetime estimate;
   determining that the second signal processing settings will increase a lifetime of the given acoustic component of the second type by determining that the second lifetime estimate is greater than the first lifetime estimate; and
   based at least on the determining that the second lifetime estimate is greater than the first lifetime estimate, sending the second signal processing settings to a third playback device to configure the third playback device to play back audio with the second signal processing settings.

2. The method of claim 1, wherein the first lifetime estimate is determined by operating the first set of audio playback devices at the predetermined volume until the first type of acoustic component fails.

3. The method of claim 1, wherein the one or more statistics comprise an indication of cyclic movement of the given acoustic component of the second type.

4. The method of claim 1, wherein receiving the first lifetime estimate for the first type of acoustic component included in the first set of playback devices configured with the first signal processing settings comprises receiving the first lifetime estimate from memory.

5. The method of claim 1, wherein the given acoustic component of the second type is a transducer, and
   wherein the one or more statistics associated with the movement of the given acoustic component of the second type comprise a displacement value of a diaphragm of the transducer.

6. The method of claim 1, further comprising:
   determining a usage of the third playback device; and
   wherein sending the second signal processing settings to a third playback device to configure the third playback device to play back audio with the second signal processing settings based at least on the determining that the second lifetime estimate is greater than the first lifetime estimate comprises:
   based on both the determining that the second lifetime estimate is greater than the first lifetime estimate and based on the usage of the third playback device, sending the second signal processing settings to the third playback device to cause the third playback device to play back audio with the second signal processing settings, thereby increasing a lifetime of the third playback device.

7. The method of claim 1, wherein determining the second lifetime estimate comprises adjusting the first lifetime estimate based on an indication of usage of the second audio playback device.

8. The method of claim 1, wherein the one or more statistics associated with movement of the given acoustic component of the second type comprise average stress statistics related to movement of the given acoustic component.

9. A network device comprising:
   at least one processor; and
   a non-transitory computer-readable storage medium storing instructions thereon that are executable by the at least one processor to cause the network device to:
   receive a first lifetime estimate for a first type of acoustic component included in a first set of playback devices that are each configured to play back audio content with first signal processing settings that govern a manner in which each of the first set of playback devices outputs audio,
   wherein the first lifetime estimate is determined by mechanically stressing the first type of acoustic component of each of the first set of playback devices by operating each of the first set of playback devices at a predetermined volume;
   after a second playback device having a given acoustic component of a second type has been configured to play back audio content with second signal processing settings that govern a manner in which the second playback device outputs audio;

receive one or more statistics associated with movement of the given acoustic component of the second type that occurred while the second playback device played back the audio content with the second signal processing settings;

determine a second lifetime estimate for the given acoustic component of the second type based on the one or more statistics associated with the movement of the given acoustic component of the second type and the first lifetime estimate;

determine that the second signal processing settings will increase a lifetime of the given acoustic component of the second type by determining that the second lifetime estimate is greater than the first lifetime estimate; and based at least on the determining that the second lifetime estimate is greater than the first lifetime estimate, send the second signal processing settings to a third playback device to configure the third playback device to play back audio with the second signal processing settings.

10. The network device of claim 9, wherein the one or more statistics comprise an indication of cyclic movement of the given acoustic component of the second type.

11. The network device of claim 9, wherein receiving the first lifetime estimate for the first type of acoustic component included in the first set of audio playback devices configured with the first signal processing settings comprises receiving the first lifetime estimate from memory.

12. The network device of claim 9,
wherein the given acoustic component of the second type is a transducer, and
wherein the one or more statistics associated with the movement of the given acoustic component comprise a displacement value of a diaphragm of the transducer.

13. The network device of claim 9, the non-transitory computer-readable storage medium further comprising instructions that are executable to cause the network device to:
determine a usage of the third playback device; and
wherein the instructions that are executable to cause the network device to send the second signal processing settings to a third playback device to configure the third playback device to play back audio with the second signal processing settings based at least on the determining that the second lifetime estimate is greater than the first lifetime estimate further comprise instructions that are executable to cause the network device to:
based on both the determining that the second lifetime estimate is greater than the first lifetime estimate and based on the usage of the third playback device, send the second signal processing settings to the third playback device to cause the third playback device to play back audio based on the second signal processing settings, thereby increasing a lifetime of the third playback device.

14. A tangible, non-transitory computer-readable memory having stored thereon instructions that are executable by one or more processors of a computing device to cause the computing device to:
receive a first lifetime estimate for a first type of acoustic component included in a first set of playback devices that are each configured to play back audio content with first signal processing settings that govern a manner in which each of the first set of playback devices outputs audio,
wherein the first lifetime estimate is determined by mechanically stressing the first type of acoustic component of each of the first set of playback devices by operating each of the first set of playback devices at a predetermined volume;
after a second playback device having a given acoustic component of a second type has been configured to play back audio content with second signal processing settings that govern a manner in which the second playback device outputs audio;
receive one or more statistics associated with movement of the given acoustic component of the second type that occurred while the second playback device played back the audio content with the second signal processing settings;
determine a second lifetime estimate for the given acoustic component of the second type based on the one or more statistics associated with the movement of the given acoustic component of the second type and the first lifetime estimate;
determine that the second signal processing settings will increase a lifetime of the given acoustic component of the second type by determining that the second lifetime estimate is greater than the first lifetime estimate; and
based at least on the determining that the second lifetime estimate is greater than the first lifetime estimate, send the second signal processing settings to a third playback device to configure the third playback device to play back audio with the second signal processing settings.

15. The tangible, non-transitory computer-readable memory of claim 14, wherein the one or more statistics comprise an indication of cyclic movement of the given acoustic component of the second type.

16. The tangible, non-transitory computer-readable memory of claim 14, wherein the given acoustic component of the second type is a transducer, and
wherein the one or more statistics associated with movement of the given acoustic component comprise a displacement value of a diaphragm of the transducer.

17. The tangible, non-transitory computer-readable memory of claim 14, wherein the non-transitory computer-readable memory further comprises instructions that are executable to cause the computing device to:
determine a usage of the third playback device; and
wherein the instructions that are executable to cause the computing device to send the second signal processing settings to a third playback device to configure the third playback device to play back audio with the second signal processing settings based at least on the determining that the second lifetime estimate is greater than the first lifetime estimate further comprise instructions that are executable to cause the computing device to:
based both the determining that the second lifetime estimate is greater than the first lifetime estimate and based on the usage of the third playback device, send the second signal processing settings to the third playback device to cause the third playback device to play back audio based on the second signal processing settings, thereby increasing a lifetime of the third playback device.

18. The method of claim 1, wherein the first and second signal processing settings comprise one or more settings of: (i) volume, (ii) loudness, (ii) bass, (iii) treble, or (iv) frequency equalization.

19. The method of claim 1,
    wherein the given acoustic component of the second type is substantially similar to the first type of acoustic component.

20. The network device of claim 9, wherein the first and second signal processing settings comprise one or more settings of: (i) volume, (ii) loudness, (ii) bass, (iii) treble, or (iv) frequency equalization.

\* \* \* \* \*